US011202382B2

(12) United States Patent
Feng

(10) Patent No.: US 11,202,382 B2
(45) Date of Patent: Dec. 14, 2021

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zikang Feng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/966,152

(22) PCT Filed: Apr. 9, 2020

(86) PCT No.: PCT/CN2020/084032
§ 371 (c)(1),
(2) Date: Jul. 30, 2020

(87) PCT Pub. No.: WO2021/120456
PCT Pub. Date: Jun. 24, 2021

(65) Prior Publication Data
US 2021/0195776 A1  Jun. 24, 2021

(51) Int. Cl.
*H05K 5/00*  (2006.01)
*H05K 5/02*  (2006.01)

(52) U.S. Cl.
CPC ......... *H05K 5/0226* (2013.01); *H05K 5/0017* (2013.01); *H05K 5/0086* (2013.01)

(58) Field of Classification Search
None
See application file for complete search history.

(56) References Cited

U.S. PATENT DOCUMENTS 9,348,450 B1 * 5/2016 Kim ...................... G06F 1/1681
9,535,452 B2 * 1/2017 Ahn ..................... H05K 5/0017
(Continued)

FOREIGN PATENT DOCUMENTS

CN  107731100 A  2/2018
CN  108879072 A  11/2018
(Continued)

*Primary Examiner* — Anthony Q Edwards
*Assistant Examiner* — Rashen E Morrison
(74) *Attorney, Agent, or Firm* — Mark M. Friedman

(57) ABSTRACT

A display device is disclosed and includes: a first back housing, wherein the first back housing includes a first rotating shaft and a second rotating shaft; a middle frame, wherein the middle frame includes a first middle frame connected to the first back housing by the first rotating shaft, a second middle frame connected to the first back housing by the second rotating shaft, and a plurality of sliding components disposed on lateral sides of the first middle frame and the second middle frame; a supporting plate, wherein the supporting plate includes a first supporting plate, a second supporting plate, a third supporting plate, and a fourth supporting plate which are connected to the sliding components; and a first display screen, wherein the first display screen is attached to the first supporting plate and the fourth supporting plate.

20 Claims, 6 Drawing Sheets

(56) References Cited

U.S. PATENT DOCUMENTS

| | | | |
|---|---|---|---|
| 9,600,035 B2* | 3/2017 | Park | G06F 1/1681 |
| 10,254,803 B1* | 4/2019 | Quinn | G06F 1/1643 |
| 10,296,052 B1* | 5/2019 | Quinn | G06F 1/1656 |
| 10,296,053 B1* | 5/2019 | Quinn | G06F 1/1649 |
| 10,712,832 B2* | 7/2020 | Torres | G06F 3/1423 |
| 11,044,825 B1* | 6/2021 | Han | H05K 5/0226 |
| 11,054,857 B2* | 7/2021 | Noh | G06F 1/1688 |
| 2012/0002360 A1* | 1/2012 | Seo | G06F 1/1652 |
| | | | 361/679.01 |
| 2012/0044620 A1* | 2/2012 | Song | G06F 1/1681 |
| | | | 361/679.01 |
| 2012/0120618 A1* | 5/2012 | Bohn | G06F 1/1681 |
| | | | 361/749 |
| 2013/0002964 A1* | 1/2013 | Kodaira | H04N 5/64 |
| | | | 348/731 |
| 2013/0010405 A1* | 1/2013 | Rothkopf | H05K 5/0226 |
| | | | 361/679.01 |
| 2013/0021762 A1* | 1/2013 | van Dijk | H04M 1/022 |
| | | | 361/749 |
| 2014/0111954 A1* | 4/2014 | Lee | G06F 1/1652 |
| | | | 361/749 |
| 2015/0227166 A1* | 8/2015 | Lee | G06F 1/169 |
| | | | 345/173 |
| 2015/0366089 A1* | 12/2015 | Park | G06F 1/1641 |
| | | | 361/679.01 |
| 2018/0364761 A1* | 12/2018 | Lin | H05K 9/0075 |
| 2019/0258295 A1* | 8/2019 | Fujimoto | G09F 9/00 |
| 2019/0320048 A1* | 10/2019 | Yang | H04M 1/0247 |
| 2019/0380219 A1 | 12/2019 | Lee | |
| 2020/0051468 A1* | 2/2020 | Jung | H01Q 21/30 |
| 2020/0060020 A1* | 2/2020 | Park | G06F 1/1616 |
| 2020/0103935 A1* | 4/2020 | Hsu | G06F 1/1681 |

FOREIGN PATENT DOCUMENTS

| | | |
|---|---|---|
| CN | 109308846 A | 2/2019 |
| CN | 109461383 A | 3/2019 |
| CN | 109637377 A | 4/2019 |
| CN | 209201112 U | 8/2019 |
| CN | 110459131 A | 11/2019 |

* cited by examiner

DISPLAY DEVICE

FIELD

The present disclosure relates to the field of display technologies, and more particularly, relates to a display device.

BACKGROUND

With development of mobile terminals, mobile terminals with large screens have become more and more popular.

However, portability of mobile terminals is reduced due to their large screens. Therefore, it is necessary to provide a display device simultaneously having portability and large screen.

An objective of the present disclosure is to provide a display device with improved portability.

SUMMARY

An embodiment of the present disclosure provides a display device, including:

a back housing, wherein the back housing includes a first back housing, and the first back housing includes a first rotating shaft, a second rotating shaft, and a middle frame;

The middle frame includes:

a first middle frame, wherein the first middle frame is connected to the first back housing by the first rotating shaft;

a second middle frame, wherein the second middle frame is connected to the first back housing by the second rotating shaft, the second middle frame is rotated by the second rotating shaft with respect to the first middle frame, and the first middle frame is rotated by the first rotating shaft with respect to the second middle frame;

a plurality of sliding components, wherein the sliding components are respectively disposed at a lateral side of the first middle frame and a lateral side of the second middle frame;

a supporting plate, wherein the supporting plate is disposed on the middle frame and includes a first supporting plate, a second supporting plate, a third supporting plate, and a fourth supporting plate, which sequentially adjacent to each other, and the first supporting plate, the second supporting plate, the third supporting plate, and the fourth plate are connected to the sliding components corresponding thereto; and a first display screen, wherein the first display screen is disposed on the supporting plate, a portion of the first display screen corresponding to first supporting plate is attached to the first supporting plate, and a portion of the first display screen corresponding to the fourth supporting plate is attached to the fourth supporting plate.

Both the first rotating shaft and the second rotating shaft are gear shafts, a first gear is disposed at an end of the first middle frame, and a second gear is disposed at an end of the second middle frame.

When the first gear is mounted on the first rotating shaft and the second gear is mounted on the second rotating shaft, the first gear and the second gear mesh with each other.

The first middle frame includes a first outer frame, a second outer frame, and a first connector, the first outer frame corresponds to the second outer frame, and the first outer frame is connected to a bottom of the second outer frame by the first connector.

The second middle frame includes a third outer frame, a fourth outer frame, and a second connector, the third outer frame corresponds to the fourth outer frame, and the third outer frame is connected to a bottom of the fourth outer frame by the second connector.

In one embodiment, the first outer frame, the second outer frame, the third outer frame, and the fourth outer frame are provided with a chute, and the corresponding sliding components are mounted on the chute.

In one embodiment, a first attachment part is disposed on the sliding components.

The first supporting plate, the second supporting plate, the third supporting plate, and the fourth supporting plate are provided with a second attachment part.

After the supporting plate is disposed on the middle frame, the first attachment part is inserted into the second attachment part corresponding thereto.

In one embodiment, both a lateral surface of the first middle frame and a lateral surface of the second middle frame are provided with a first attachment component, the back housing further includes a second back housing and a third back housing, and both a lateral surface of the second back housing and a lateral surface of the third back housing are provided with a second attachment component.

When the display device is assembled, the second back housing is attached to the first middle frame by the first attachment component and the second attachment component, and the third back housing is attached to the second middle frame by the first attachment component and the second attachment component.

In one embodiment, the display device further includes a second display screen disposed on a side of the second back housing away from the first middle frame.

In one embodiment, the display device further includes:

a battery disposed on an inner surface of the second back housing;

and a system plate disposed on an inner surface of the third back housing.

In one embodiment, the display device further includes:

a first wire, wherein the battery is connected to the system plate by the first wire; and a second wire, wherein the second display screen is connected to the system plate by the second wire; and The first wire and the second wire are attached to an inner surface of the first back housing.

In one embodiment, the display device further includes:

a first sensor disposed on an inner surface of the second back housing;

a second sensor disposed on an inner surface of the third back housing; and a controller configured to turn off or turn on the second display screen according to changes in distance between the first sensor and the second sensor.

An embodiment of the present disclosure provides a display device, including:

a back housing, wherein the back housing includes a first back housing, and the first back housing includes a first rotating shaft, a second rotating shaft, and a middle frame;

The middle frame includes:

a first middle frame, wherein the first middle frame is connected to the first back housing by the first rotating shaft;

a second middle frame, wherein the second middle frame is connected to the first back housing by the second rotating shaft, the second middle frame is rotated by the second rotating shaft with respect to the first middle frame, and the first middle frame is rotated by the first rotating shaft with respect to the second middle frame;

a plurality of sliding components, wherein the sliding components are respectively disposed at a lateral side of the first middle frame and a lateral side of the second middle frame;

a supporting plate, wherein the supporting plate is disposed on the middle frame and includes a first supporting plate, a second supporting plate, a third supporting plate, and a fourth supporting plate, which sequentially adjacent to each other, and the first supporting plate, the second supporting plate, the third supporting plate, and the fourth plate are connected to the sliding components corresponding thereto; and a first display screen, wherein the first display screen is disposed on the supporting plate, a portion of the first display screen corresponding to first supporting plate is attached to the first supporting plate, and a portion of the first display screen corresponding to the fourth supporting plate is attached to the fourth supporting plate;

In one embodiment, both the first rotating shaft and the second rotating shaft are gear shafts, a first gear is disposed at an end of the first middle frame, and a second gear is disposed at an end of the second middle frame.

When the first gear is mounted on the first rotating shaft and the second gear is mounted on the second rotating shaft, the first gear and the second gear mesh with each other.

In one embodiment, the first middle frame includes a first outer frame, a second outer frame, and a first connector, the first outer frame corresponds to the second outer frame, and the first outer frame is connected to a bottom of the second outer frame by the first connector.

The second middle frame includes a third outer frame, a fourth outer frame, and a second connector, the third outer frame corresponds to the fourth outer frame, and the third outer frame is connected to a bottom of the fourth outer frame by the second connector.

In one embodiment, the first outer frame, the second outer frame, the third outer frame, and the fourth outer frame are provided with a chute, and the corresponding sliding components are mounted on the chute.

In one embodiment, a first attachment part is disposed on the sliding components.

The first supporting plate, the second supporting plate, the third supporting plate, and the fourth supporting plate are provided with a second attachment part.

After the supporting plate is disposed on the middle frame, the first attachment part is inserted into the second attachment part corresponding thereto.

In one embodiment, both a lateral surface of the first middle frame and a lateral surface of the second middle frame are provided with a first attachment component, the back housing further includes a second back housing and a third back housing, and both a lateral surface of the second back housing and a lateral surface of the third back housing are provided with a second attachment component.

When the display device is assembled, the second back housing is attached to the first middle frame by the first attachment component and the second attachment component, and the third back housing is attached to the second middle frame by the first attachment component and the second attachment component.

In one embodiment, the display device further includes a second display screen disposed on a side of the second back housing away from the first middle frame.

In one embodiment, the display device further includes:

a battery disposed on an inner surface of the second back housing; and a system plate disposed on an inner surface of the third back housing.

In one embodiment, the display device further includes:

a first wire, wherein the battery is connected to the system plate by the first wire; and a second wire, wherein the second display screen is connected to the system plate by the second wire.

The first wire and the second wire are attached to an inner surface of the first back housing.

In one embodiment, the display device further includes:

a first sensor disposed on an inner surface of the second back housing;

a second sensor disposed on an inner surface of the third back housing; and a controller configured to turn off or turn on the second display screen according to changes in distance between the first sensor and the second sensor.

In one embodiment, a headphone port and a first microphone port are defined on a lateral surface of the second back housing, a universal serial bus (USB) port and a second microphone port are defined on a lateral surface of the third back housing, and a camera lens hole and a flash hole are defined on a backside of the third back housing.

In one embodiment, the display device further includes a front frame disposed on the first display screen and attached to a lateral surface of the middle frame.

Regarding the beneficial effects: in a display device provided by an embodiment of the present disclosure, first a first middle frame and a second middle frame are rotatably connected to the first back housing. Then, a plurality of sliding components are disposed on each of a lateral surface of the first middle frame and a lateral surface of the second middle frame. Next, a first supporting plate, a second supporting plate, a third supporting plate, and a fourth supporting plate are connected to the sliding components corresponding thereto. Last, a portion of a display screen corresponds to and is attached to the fourth supporting plate. When the display device is rotated, the first middle frame and the second middle frame are rotated around the first back housing, making the supporting plates disposed thereon form a Y-shaped containing space. Therefore, the first display screen can be contained in the Y-shaped containing space, thereby improving portability of the display device.

DESCRIPTION OF DRAWINGS

To clearly illustrate the above contents of the present disclosure, detailed descriptions are described below in conjunction with embodiments and drawings.

DETAILED DESCRIPTION

Figure 1:
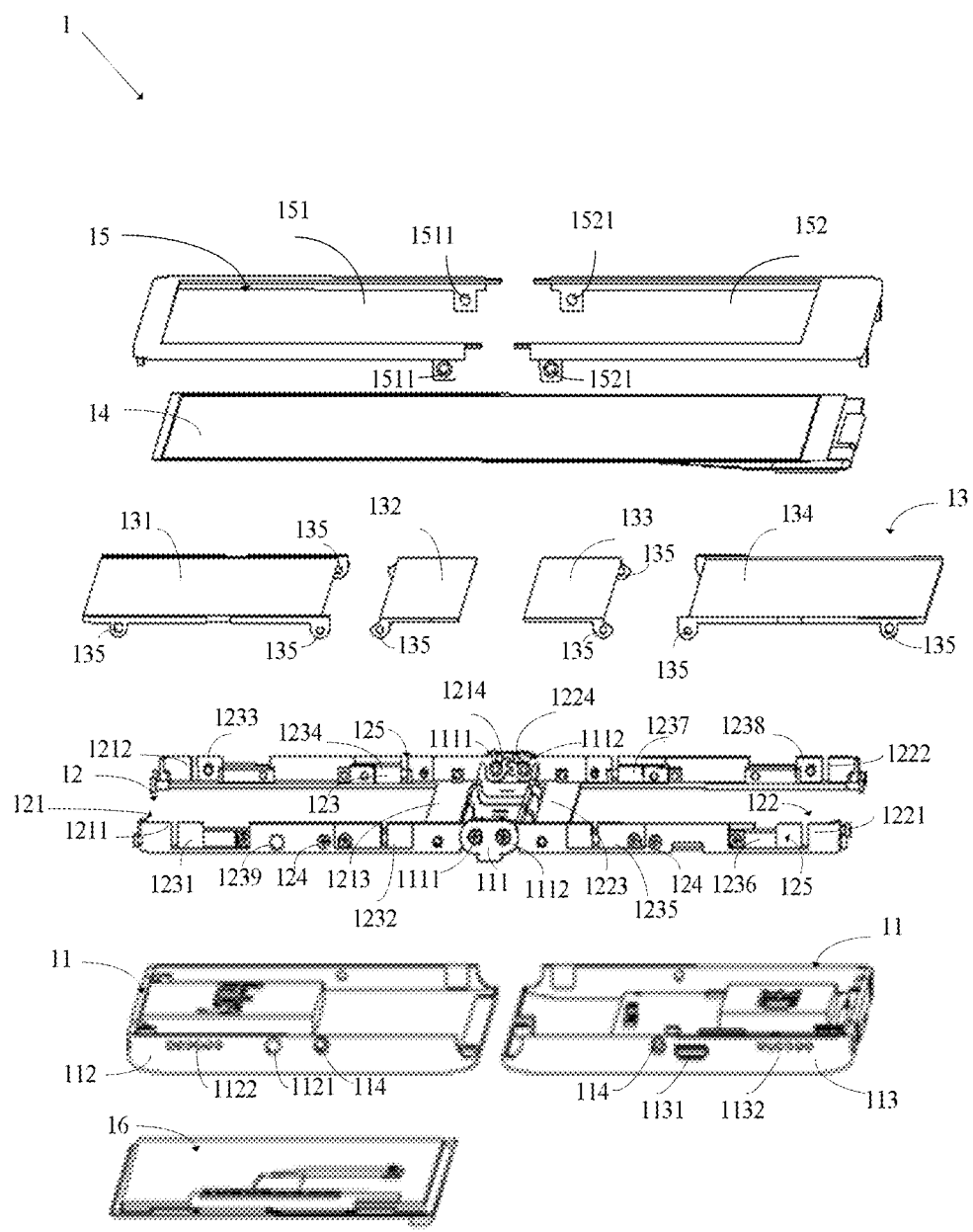
FIG. 1 is an explosion diagram of a display device provided by an embodiment of the present disclosure.

The following description of the various embodiments is provided with reference to the accompanying drawings. The embodiments described with reference to the attached drawings are all exemplary and are intended to illustrate and interpret the present disclosure. It should be understood that terms such as "top", "bottom", "front", "rear", "left", "right", "inside", "outside", "lateral", as well as derivatives thereof should be construed to refer to the orientation as then described or as shown in the drawings under discussion. These relative terms are for convenience of description, and shall not be construed as causing limitations to the present disclosure.

In the drawings, the identical or similar reference numerals constantly denote the identical or similar elements or elements having the identical or similar functions.

Specific features, structures, and characteristics which are mentioned in the present disclosure may be included in at least one embodiment. Phrases in the present disclosure are not necessary to refer to the same embodiment and do not refer to an independent embodiment and an alternative embodiment which are exclusive to other embodiments. It should be explicitly and implicitly understood by those skilled in the art that embodiments described in the present disclosure may be combined with other embodiments.

An embodiment of the present disclosure provides a display device. As shown in FIG. 1, an explosion diagram of a display device is provided. A display device 1 includes a back housing 11, a middle frame 12, a supporting plate 13, and a first display screen 14.

The back housing 11 includes a first back housing 111. The first back housing 111 includes a first rotating shaft 1111 and a second rotating shaft 1112. Both the first rotating shaft 1111 and the second rotating shaft 1112 may be gear shafts.

In one embodiment, the back housing 11 further includes a second back housing 112 and a third back housing 113. Both a lateral surface of the second back housing 112 and a lateral surface of the third back housing 113 are provided with a second attachment component 114. As shown in FIG. 1, the second attachment component 114 may be a through hole.

Figure 2:
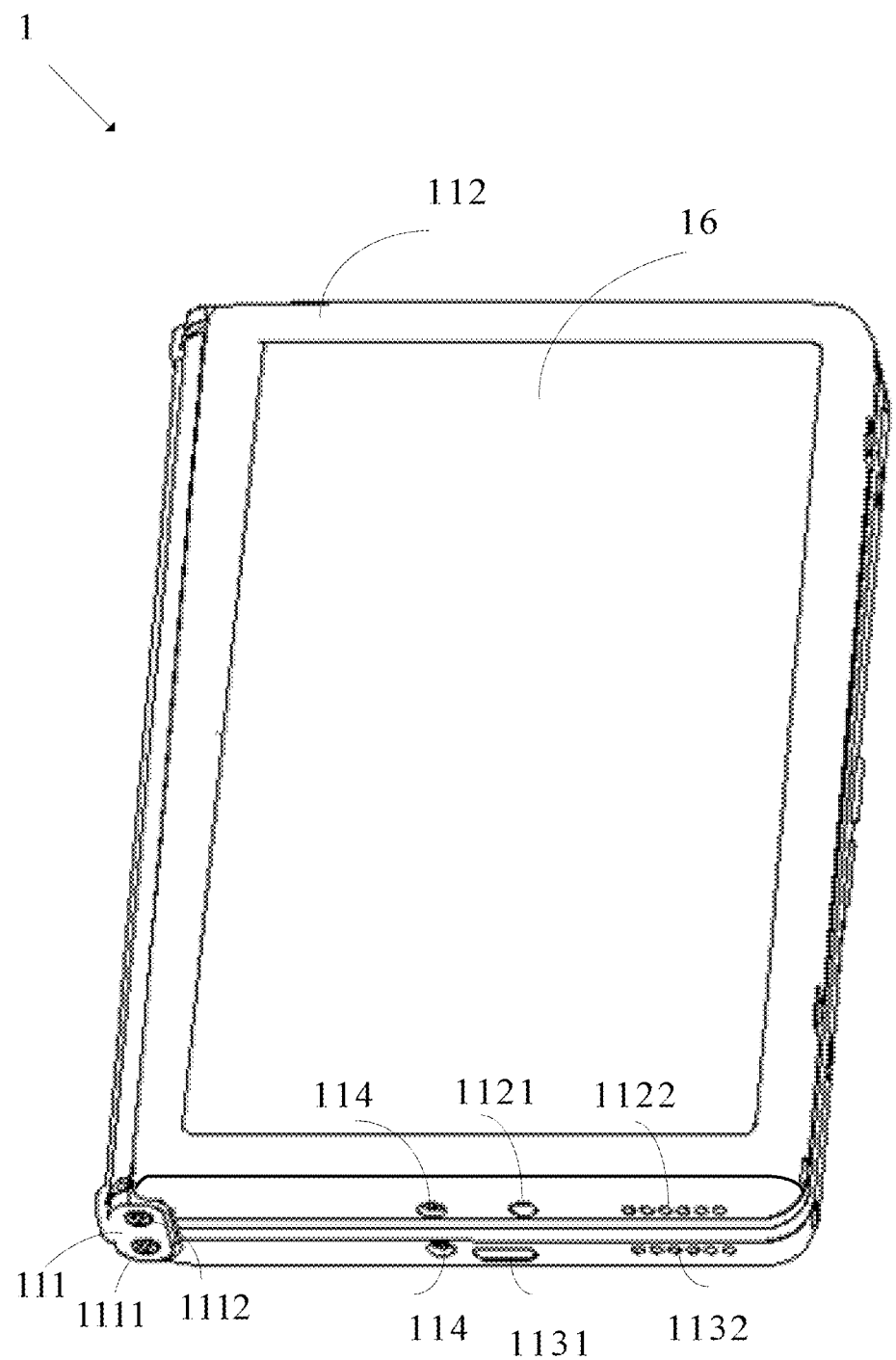
FIG. 2 is a schematic structural view showing a front side of a bent display device provided by the embodiment of the present disclosure.
Figure 3:
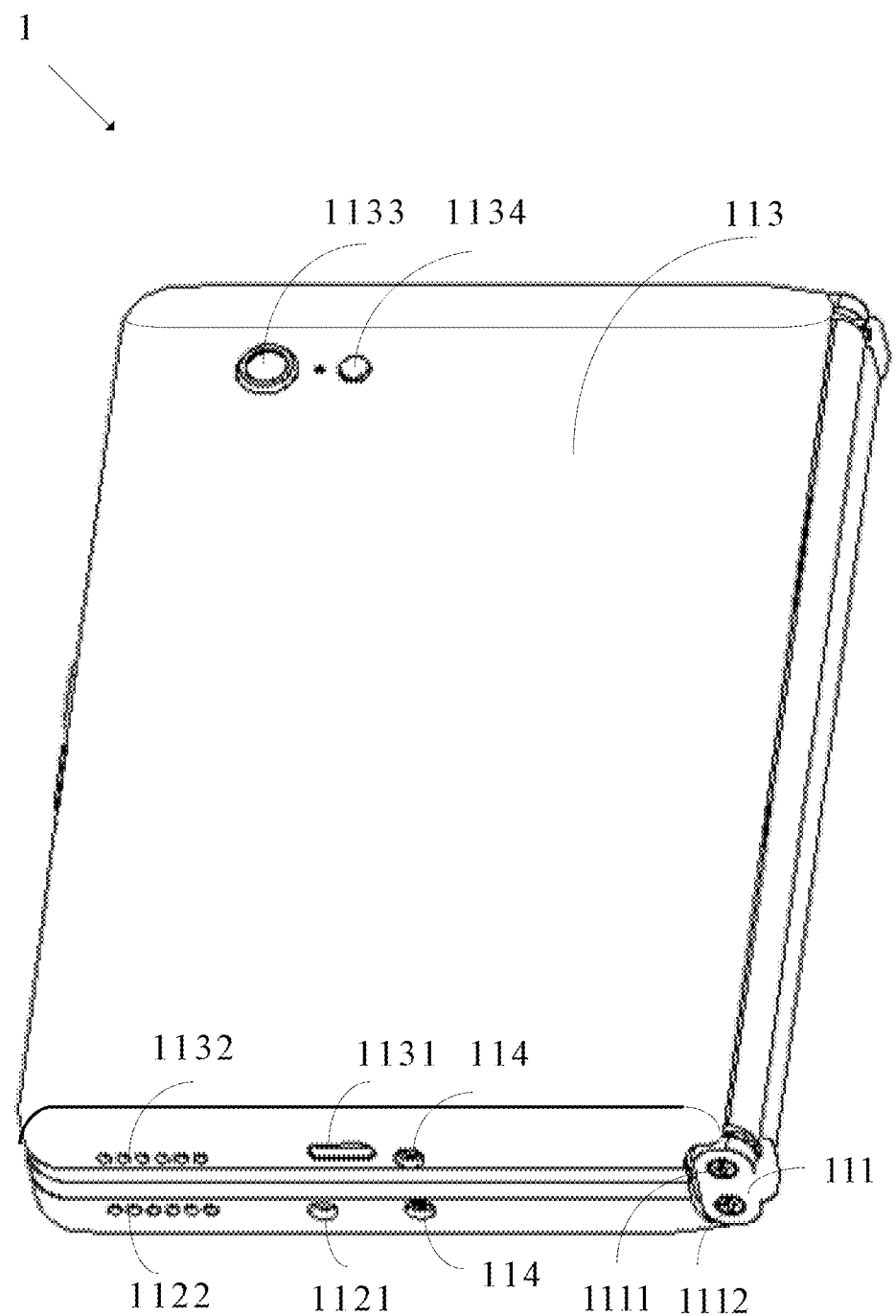
FIG. 3 is a schematic structural view showing a backside of the bent display device provided by the embodiment of the present disclosure.
Figure 4:
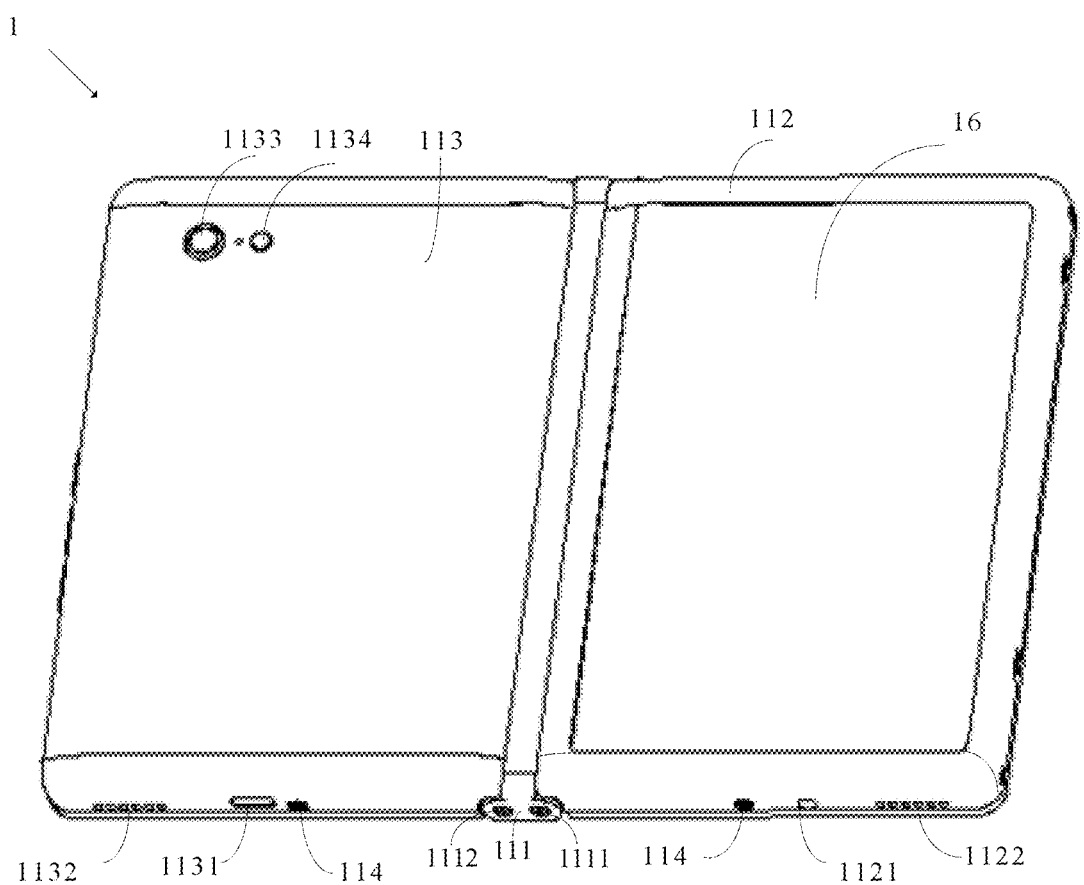
FIG. 4 a schematic structural view showing an expanded display device provided by the embodiment of the present disclosure.

In one embodiment, as shown in FIGS. 2 to 4, a headphone port 1121 and a first microphone port 1122 are defined on a lateral surface of the second back housing 112. A universal serial bus (USB) port 1131 and a second microphone port 1132 are defined on a lateral surface of the third back housing 113, and a camera lens hole 1133 and a flash hole 1134 are defined on a backside of the third back housing 113. Correspondingly, components corresponding to the above ports and holes are disposed on inner sides of the second back housing 112 and the third back housing 113. For example, a microphone component corresponding to the first microphone port 1122 is defined on the inner side of the second back housing 112, and a camera lens component corresponding to the camera lens port 1133 is disposed on the inner side of the third back housing 113.

As shown in FIG. 1, the middle frame 12 includes a first middle frame 121, a second middle frame 122, and a plurality of sliding components 123. In one embodiment, the first middle frame 121 includes a first outer frame 1211 and a second outer frame 1212. The first outer frame 1211 corresponds to the second outer frame 1212. The second middle frame 122 includes a third outer frame 1221 and a fourth outer frame 1222. The third outer frame 1221 corresponds to the fourth outer frame 1222.

In one embodiment, both a lateral surface of the first middle frame 121 and a lateral surface of the second middle frame 122 are provided with a first attachment component 124. Specifically, the first outer frame 1211, the second outer frame 1212, the third outer frame 1221, and the fourth outer frame 1222 are provided with the first attachment component 124. The first attachment component 124 corresponds to the second attachment components 114 disposed on the lateral surfaces of the second back housing 112 and the third back housing 113. When the display device 1 is assembled, the second back housing 112 is attached to the first middle frame 121 by the first attachment component 124 and the second attachment component 114, and the third back housing 113 is attached to the second middle frame 122 by the first attachment component 124 and the second attachment component 114.

Specifically, when the second attachment component 114 is a through hole, the first attachment component 124 may also be a through hole having a similar size and a similar shape to those of the second attachment component 114. When the display device 1 is assembled, first a through hole of the second attachment component 114 is aligned with a through hole of the first attachment component 124. Then, a screw is inserted into the two through holes, and a nut is mounted on the screw, thereby attaching the second back housing 112 to the first middle frame 121, and attaching the third back housing 113 to the second middle frame 122.

As shown in FIG. 1, a first through hole is defined at an end of the first middle frame 121. Specifically, both an end of the first outer frame 1211 and an end of the second outer frame 1212 are provided with the first through hole. After the first rotating shaft 1111 of the first back housing 111 passes through the first through hole, a nut is mounted on the first rotating shaft 1111, thereby making the first middle frame 121 be connected to the first back housing 111 by the first rotating shaft 1111.

Similarly, a second through hole is defined at an end of the second middle frame 122. Specifically, both an end of the third outer frame 1221 and an end of the fourth outer frame 1222 are provided with the second through hole. After the second rotating shaft 1112 of the first back housing 111 passes through the second through hole, a nut is mounted on the second rotating shaft 1112, thereby making the second middle frame 122 be connected to the first back housing 111 by the second rotating shaft 1112.

Therefore, the first middle frame 121 can be rotated with respect to the second middle frame 122 by the first rotating shaft 1111, and the second middle frame 122 can be rotated with respect to the first middle frame 121 by the second rotating shaft 1112.

In one embodiment, when both the first rotating shaft 1111 and the second rotating shaft 1112 are gear shafts, a first gear 1214 is disposed at an end of the first middle frame 121, and a second gear 1224 is disposed at an end of the second middle frame 122. When the first gear 1214 is mounted on the first rotating shaft 1111 and the second gear 1224 is mounted on the second rotating shaft 1112, the first gear 1214 and the second gear 1224 mesh with each other. Therefore, when the first middle frame 121 is rotated, it can drive the second middle frame 122 to rotate as well. Correspondingly, when the second middle 122 is rotated, it can drive the first middle frame 121 to rotate as well.

It should be noted that the first through hole is defined on a first gear 1214, and the second through hole is defined on a second gear 1224. The first rotating shaft 1111 passes through the first gear 1214, thereby making the first gear 1214 be mounted on the first rotating shaft 1111. The second rotating shaft 1112 passes through the second gear 1224, thereby making the second gear 1224 be mounted on the second rotating shaft 1112.

In one embodiment, the lateral surface of the first middle frame 121 and the lateral surface of the second middle frame 122 are provided with a chute 125. Specifically, the first outer frame 1211, the second outer frame 1212, the third outer frame 1221, and the fourth outer frame 1222 are provided with the chute 125.

Correspondingly, the middle frame 12 further includes a plurality of sliding components 123. The sliding components 123 are respectively disposed at a lateral side of the first middle frame 121 and a lateral side of the second middle frame 122. As shown in FIG. 1, the sliding components 123 include a first sliding component 1231, a second sliding component 1232, a third sliding component 1233, a fourth sliding component 1234, a fifth sliding component 1235, a sixth sliding component 1236, a seventh sliding component 1237, and an eighth sliding component 1238.

The first sliding component 1231 and the second sliding component 1232 are disposed on the first outer frame 1211. The third sliding component 1233 and the fourth sliding component 1234 are disposed on the second outer component 1212. The first sliding component 1231 corresponds to the third sliding component 1233. The second sliding component 1232 corresponds to the fourth sliding component 1234. It should be noted that when the first middle frame 121 and the first back housing 111 are assembled, the first sliding component 1231 and the third sliding component 1233 are away from the first back housing 111, and the second sliding component 1232 and the fourth sliding component 1234 are close to the first back housing 111.

The fifth sliding component 1235 and the sixth sliding component 1236 are disposed on the third outer frame 1221. The seventh sliding component 1237 and the eighth sliding component 1238 are disposed on the fourth outer component 1222. The fifth sliding component 1235 corresponds to the seventh sliding component 1237. The sixth sliding component 1236 corresponds to the eighth sliding component 1238. It should be noted that when the second middle frame 122 and the first back housing 111 are assembled, the fifth sliding component 1235 and the seventh sliding component 1237 are close to the first back housing 111, and the sixth sliding component 1236 and the eighth sliding component 1238 are away from the first back housing 111.

The sliding components 123 are mounted in the chute 125 corresponding thereto and can slide on the chute 125. In one embodiment, a plurality of attachment shafts 1239 are further disposed on each of the sliding components 123.

In one embodiment, the first middle frame 121 further includes a first connector 1213. The first outer frame 1211 and a bottom of the second outer frame 1212 are connected to each other by the first connector 1213, thereby attaching the first outer frame 1211 to the second outer frame 1212.

The second middle frame 122 further includes a second connector 1223. The third outer frame 1221 and a bottom of the fourth outer frame 1222 are connected to each other by the second connector 1223, thereby attaching the third outer frame 1221 to the fourth outer frame 1222.

The first connector 1213 is disposed at the end of the first middle frame 121 having the first through hole, and the second connector 1223 is disposed at the end of the second middle frame 122 having the second through hole.

The supporting plate 13 is attached to the middle frame 12 by the attachment shaft 1239. Specifically, as shown in FIG. 1, two opposite lateral edges of the supporting plate 13 are provided with an attachment hole 135. When the display device 1 is assembled, a nut is mounted after the attachment shaft 1239 passes through the attachment hole 135 corresponding thereto, thereby attaching the supporting plate 13 to the middle frame 12.

As shown in FIG. 1, the supporting plate 13 includes a first supporting plate 131, a second supporting plate 132, a third supporting plate 133, and a fourth supporting plate 134, which are sequentially disposed and are adjacent to each other.

Two opposite lateral edges of the first supporting plate 131 are respectively provided with two attachment holes 135. The first supporting plate 131 is connected to the first sliding component 1231, the second sliding component 1232, the third sliding component 1233, and the fourth sliding component 1234 by the attachment holes 135.

Two opposite lateral edges of the second supporting plate 132 are respectively provided with one attachment hole 135, and the second supporting plate 132 is connected to the second sliding component 1232 and the fourth sliding component 1234 by the attachment holes 135. It should be noted that the first supporting plate 131 and the second supporting plate 132 may be mounted on the same attachment shaft 1239 on the second sliding component 1232, or may be mounted on the same attachment shaft 1239 on the fourth sliding component 1234.

Two opposite lateral edges of the fourth supporting plate 134 are respectively provided with two attachment holes 135. The third supporting plate 133 is connected to the fifth sliding component 1235, the sixth sliding component 1236, the seventh sliding component 1237, and the eighth sliding component 1238 by the attachment holes 135.

Two opposite lateral edges of the third supporting plate 133 are respectively provided with one attachment hole 135, and the fourth supporting plate 134 is connected to the fifth sliding component 1235 and the seventh sliding component 1237 by the attachment holes 135. It should be noted that the fourth supporting plate 134 and the third supporting plate 133 may be mounted on the same attachment shaft 1239 on the fifth sliding component 1235, or may be mounted on the same attachment shaft 1239 on the seventh sliding component 1237.

In summary, the first supporting plate 131, the second supporting plate 132, the third supporting plate 133, and the fourth supporting plate 134 are connected to the sliding components 123 corresponding thereto.

Figure 5:
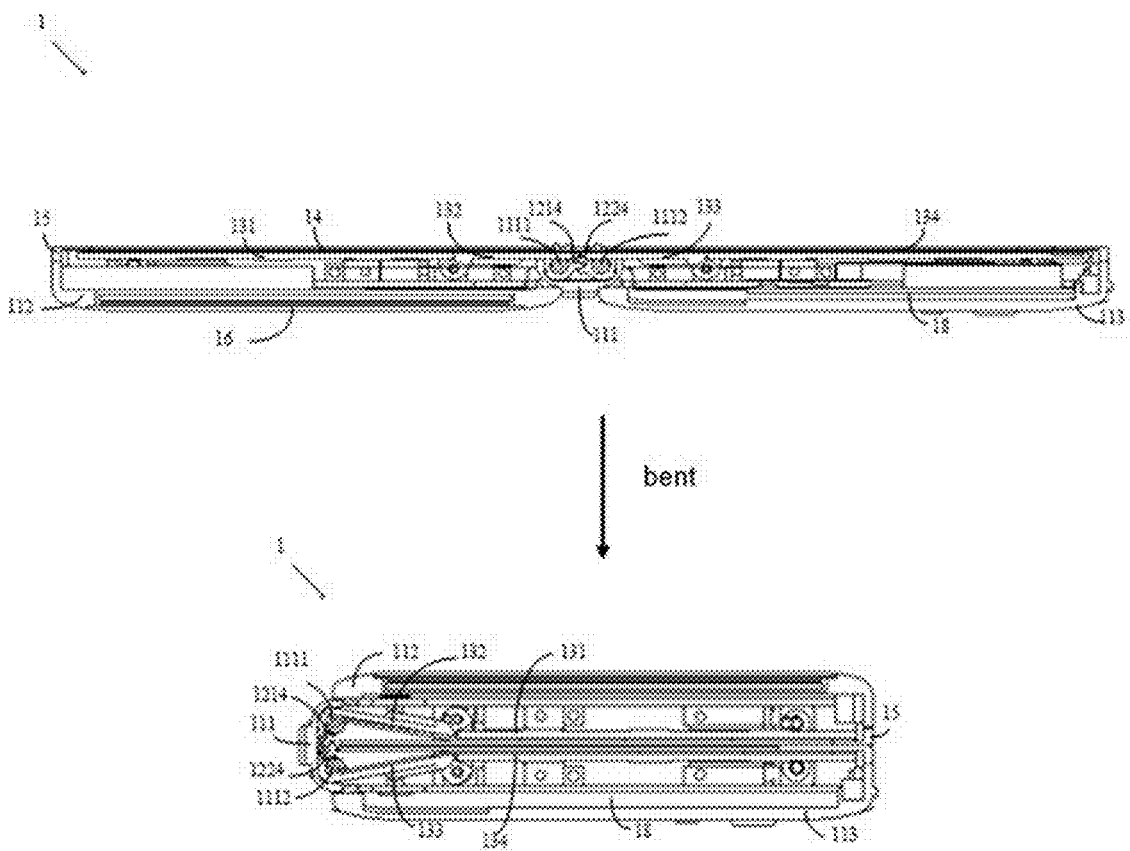
FIG. 5 is a schematic view showing a process of bending the display device provided by the embodiment of the present disclosure.

The first display screen 14 is disposed on the supporting plate 13. A portion of the first display screen 14 corresponding to the first supporting plate 131 is attached to the first supporting plate 131, and a portion of the first display screen 14 corresponding to the fourth supporting plate 134 is attached to the fourth supporting plate 134. However, a portion of the first display screen 14 corresponding to the second supporting plate 132 is not attached to the second supporting plate 132, and a portion of the first display screen 14 corresponding to the third supporting plate 133 is not attached to the third supporting plate 133. The first display screen 14 is a flexible display screen with bendability. When the display device 1 is bent, the first middle frame 121 and the second middle frame 122 are rotated with respect to the first back housing 111, thereby making the first supporting plate 131, the second supporting plate 132, the third supporting plate 133, and the fourth supporting plate 134 form a Y-shaped containing space as shown in FIG. 5. The first display screen 14 is contained in the Y-shaped containing space after being bent.

The first display screen 14 can be used to display a video, a gaming video, or a map, which needs a relatively large screen. Specifically, when the first display screen 14 is expanded from a bent state, it is turned on automatically, thereby displaying a video or a gaming video, which needs a relatively large screen.

In one embodiment, as shown in FIG. 1, the display device 1 further includes a front frame 15 disposed on the first display screen 14 and attached to a lateral surface of the middle frame 12. As shown in FIG. 1, the front frame 15 includes a first front frame 151 and a second front frame 152. Two sides of the first front frame 151 are respectively provided with a first attachment hole 1511, and two sides of the second front frame 152 are respectively provided with a second attachment hole 1521. After the first middle frame 121, the first back housing 111, and the second middle frame 122 are sequentially connected to each other and the supporting plate 13 and the second middle frame 121 are sequentially assembled, the first rotating shaft 1111 is inserted into the first attachment hole 1511, and the second rotating shaft 1112 is inserted into the second attachment hole 1521. Therefore, the front frame 15 can be attached to the middle frame 12.

In one embodiment, the display device 1 further includes a second display screen 16 disposed on a side of the second back housing 112 away from the first middle housing 121. The second display screen 16 may be a flexible screen or a non-flexible screen.

The second display screen 16 may be used in fields that do not require size of a display panel such as a telephone application, a short message application, or a clock application. Specifically, when a call is coming in, the display screen 16 can display a call notification message.

In one embodiment, as shown in FIG. 5, after the display device 1 is bent, the first supporting plate 131, the second supporting plate 132, the third supporting plate 133, and the fourth supporting plate 134 form the Y-shaped containing space, thereby providing sufficient space for containing other components.

Figure 6:
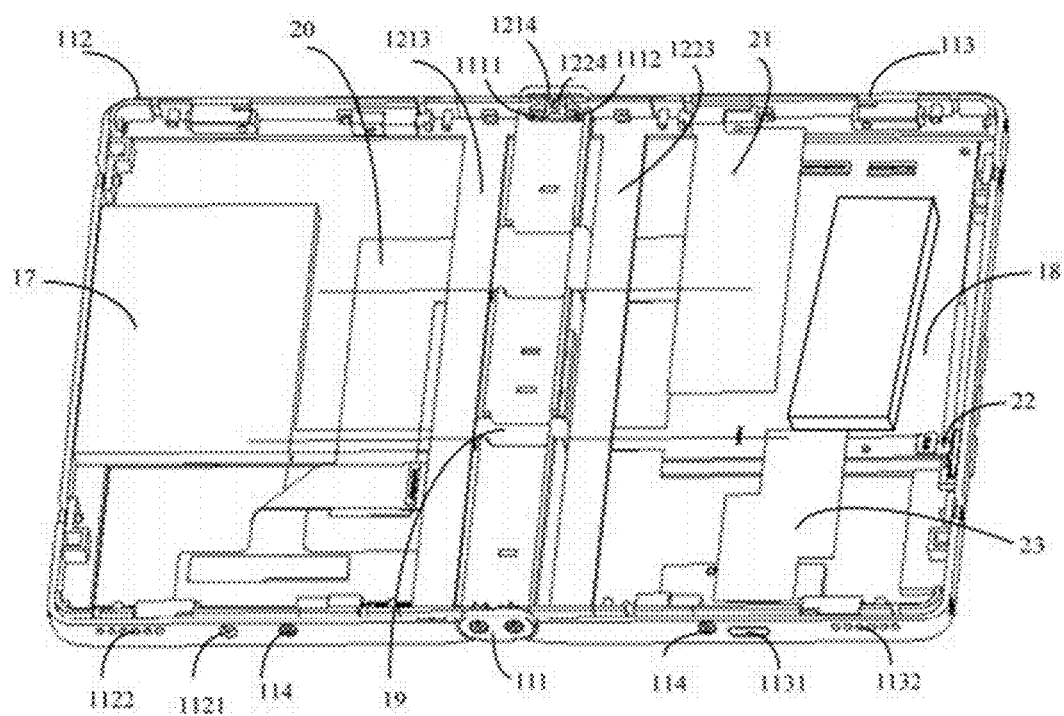
FIG. 6 is a schematic view showing structures of a middle frame and a back housing provided by the embodiment of the present disclosure.

As shown in FIG. 6, the display device 1 further includes a battery 17 and a system plate 18. The battery 17 is disposed on an inner surface of the second back housing 112, and the system plate 18 is disposed on an inner surface of the third back housing 113.

Correspondingly, the display device 1 further includes a first wire 19 and a second wire 20. The battery 17 and the system plate 18 are connected to each other by the first wire 19. The second display screen 16 and the system plate 18 are connected to each other by the second wire 20. In one embodiment, portions of the first wire 19 and the second wire 20 which pass through the inner surface of the first back housing 111 are attached to the inner surface of the first back housing 111.

Furthermore, the display device 1 further includes a fourth wire 21, a fifth wire 22, and a sixth wire 23. The first display screen 14 and the system plate 18 are connected to each other by the fourth wire 21. Other relevant components and the system plate 18 are connected to each other by the fifth wire 22. A universal serial bus (USB) and the system plate 18 are connected to each other by the sixth wire 23.

In one embodiment, the display device 1 further includes a first sensor, a second sensor, and a controller. The first sensor is disposed on the inner surface of the second back housing 112, and the second sensor is disposed on the inner surface of the third back housing 113. The controller is configured to turn off or turn on the second display screen according to changes in distance between the first sensor and the second sensor.

For example, when the display device 1 is bent from an expanded state, the controller detects a distance between the first sensor and the second sensor is gradually reduced, so that it turns off the first display screen and turns on the second display screen. When the display device 1 is expanded from a bent state, the controller detects a distance between the first sensor and the second sensor is gradually increased, so that it turns on the first display screen and turns off the second display screen.

In a display device provided by an embodiment of the present disclosure, first a first middle frame and a second middle frame are rotatably connected to the first back housing. Then, a plurality of sliding components are disposed on each of a lateral surface of the first middle frame and a lateral surface of the second middle frame. Next, a first supporting plate, a second supporting plate, a third supporting plate, and a fourth supporting plate are connected to the sliding components corresponding thereto. Last, a portion of a display screen corresponds to and attached to the fourth supporting plate. When the display device is rotated, the first middle frame and the second middle frame are rotated around the first back housing, making the supporting plates disposed thereon form a Y-shaped containing space. Therefore, the first display screen can be contained in the Y-shaped containing space, thereby improving portability of the display device.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display device, comprising:
a back housing, wherein the back housing comprises a first back housing, and the first back housing comprises a first rotating shaft, a second rotating shaft, and a middle frame;
wherein the middle frame comprises:
a first middle frame, wherein the first middle frame is connected to the first back housing by the first rotating shaft;
a second middle frame, wherein the second middle frame is connected to the first back housing by the second rotating shaft, the second middle frame is rotated by the second rotating shaft with respect to the first middle frame, and the first middle frame is rotated by the first rotating shaft with respect to the second middle frame;
a plurality of sliding components, wherein the sliding components are respectively disposed at a lateral side of the first middle frame and a lateral side of the second middle frame;
a supporting plate, wherein the supporting plate is disposed on the middle frame and comprises a first supporting plate, a second supporting plate, a third supporting plate, and a fourth supporting plate which are sequentially adjacent to each other, and the first supporting plate, the second supporting plate, the third supporting plate, and the fourth plate are connected to the sliding components corresponding thereto; and
a first display screen, wherein the first display screen is disposed on the supporting plate, a portion of the first display screen corresponding to the first supporting plate is attached to the first supporting plate, and a portion of the first display screen corresponding to the fourth supporting plate is attached to the fourth supporting plate;

wherein both the first rotating shaft and the second rotating shaft are gear shafts, a first gear is disposed at an end of the first middle frame, and a second gear is disposed at an end of the second middle frame;

when the first gear is mounted on the first rotating shaft and the second gear is mounted on the second rotating shaft, the first gear and the second gear mesh with each other;

wherein the first middle frame comprises a first outer frame, a second outer frame, and a first connector, the first outer frame corresponds to the second outer frame, and the first outer frame is connected to a bottom of the second outer frame by the first connector; and the second middle frame comprises a third outer frame, a fourth outer frame, and a second connector, the third outer frame corresponds to the fourth outer frame, and the third outer frame is connected to a bottom of the fourth outer frame by the second connector.

2. The display device of claim 1, wherein the first outer frame, the second outer frame, the third outer frame, and the fourth outer frame are provided with a chute, and the corresponding sliding components are mounted on the chute.

3. The display device of claim 1, wherein a first attachment part is disposed on the sliding components;

the first supporting plate, the second supporting plate, the third supporting plate, and the fourth supporting plate are provided with a second attachment part; and after the supporting plate is disposed on the middle frame, the first attachment part is inserted into the second attachment part corresponding thereto.

4. The display device of claim 1, wherein both a lateral surface of the first middle frame and a lateral surface of the second middle frame are provided with a first attachment component, the back housing further comprises a second back housing and a third back housing, and both a lateral surface of the second back housing and a lateral surface of the third back housing are provided with a second attachment component; and when the display device is assembled, the second back housing is attached to the first middle frame by the first attachment component and the second attachment component, and the third back housing is attached to the second middle frame by the first attachment component and the second attachment component.

5. The display device of claim 4, further comprising a second display screen disposed on a side of the second back housing away from the first middle frame.

6. The display device of claim 5, further comprising:
a battery disposed on an inner surface of the second back housing; and
a system plate disposed on an inner surface of the third back housing.

7. The display device of claim 6, further comprising:
a first wire, wherein the battery is connected to the system plate by the first wire; and
a second wire, wherein the second display screen is connected to the system plate by the second wire; and
wherein the first wire and the second wire are attached to an inner surface of the first back housing.

8. The display device of claim 5, further comprising:
a first sensor disposed on an inner surface of the second back housing;

a second sensor disposed on an inner surface of the third back housing; and
a controller configured to turn off or turn on the second display screen according to changes in distance between the first sensor and the second sensor.

9. A display device, comprising:
a back housing, wherein the back housing comprises a first back housing, and the first back housing comprises a first rotating shaft, a second rotating shaft, and a middle frame;
wherein the middle frame comprises:
a first middle frame, wherein the first middle frame is connected to the first back housing by the first rotating shaft;
a second middle frame, wherein the second middle frame is connected to the first back housing by the second rotating shaft, the second middle frame is rotated by the second rotating shaft with respect to the first middle frame, and the first middle frame is rotated by the first rotating shaft with respect to the second middle frame;
a plurality of sliding components, wherein the sliding components are respectively disposed at a lateral side of the first middle frame and a lateral side of the second middle frame;
a supporting plate, wherein the supporting plate is disposed on the middle frame and comprises a first supporting plate, a second supporting plate, a third supporting plate, and a fourth supporting plate which are sequentially adjacent to each other, and the first supporting plate, the second supporting plate, the third supporting plate, and the fourth plate are connected to the sliding components corresponding thereto; and
a first display screen, wherein the first display screen is disposed on the supporting plate, a portion of the first display screen corresponding to the first supporting plate is attached to the first supporting plate, and a portion of the first display screen corresponding to the fourth supporting plate is attached to the fourth supporting plate.

10. The display device of claim 9, wherein both the first rotating shaft and the second rotating shaft are gear shafts, a first gear is disposed at an end of the first middle frame, and a second gear is disposed at an end of the second middle frame; and when the first gear is mounted on the first rotating shaft and the second gear is mounted on the second rotating shaft, the first gear and the second gear mesh with each other.

11. The display device of claim 9, wherein the first middle frame comprises a first outer frame, a second outer frame, and a first connector, the first outer frame corresponds to the second outer frame, and the first outer frame is connected to a bottom of the second outer frame by the first connector; and the second middle frame comprises a third outer frame, a fourth outer frame, and a second connector, the third outer frame corresponds to the fourth outer frame, and the third outer frame is connected to a bottom of the fourth outer frame by the second connector.

12. The display device of claim 11, wherein the first outer frame, the second outer frame, the third outer frame, and the fourth outer frame are provided with a chute, and the corresponding sliding components are mounted on the chute.

13. The display device of claim 9, wherein a first attachment part is disposed on the sliding components;

the first supporting plate, the second supporting plate, the third supporting plate, and the fourth supporting plate are provided with a second attachment part; and after the supporting plate is disposed on the middle frame, the first attachment part is inserted into the second attachment part corresponding thereto.

14. The display device of claim 9, wherein both a lateral surface of the first middle frame and a lateral surface of the second middle frame are provided with a first attachment component, the back housing further comprises a second back housing and a third back housing, and both a lateral surface of the second back housing and a lateral surface of the third back housing are provided with a second attachment component; and when the display device is assembled, the second back housing is attached to the first middle frame by the first attachment component and the second attachment component, and the third back housing is attached to the second middle frame by the first attachment component and the second attachment component.

15. The display device of claim 14, further comprising a second display screen disposed on a side of the second back housing away from the first middle frame.

16. The display device of claim 15, further comprising:
a battery disposed on an inner surface of the second back housing; and
a system plate disposed on an inner surface of the third back housing.

17. The display device of claim 16, further comprising:
a first wire, wherein the battery is connected to the system plate by the first wire; and
a second wire, wherein the second display screen is connected to the system plate by the second wire; and
wherein the first wire and the second wire are attached to an inner surface of the first back housing.

18. The display device of claim 15, further comprising:
a first sensor disposed on an inner surface of the second back housing;
a second sensor disposed on an inner surface of the third back housing; and
a controller configured to turn off or turn on the second display screen according to changes in distance between the first sensor and the second sensor.

19. The display device of claim 14, wherein a headphone port and a first microphone port are defined on the lateral surface of the second back housing, a universal serial bus (USB) port and a second microphone port are defined on the lateral surface of the third back housing, and a camera lens hole and a flash hole are defined on a backside of the third back housing.

20. The display device of claim 9, further comprising a front frame disposed on the first display screen and attached to a lateral surface of the middle frame.

* * * * *

UNITED STATES PATENT AND TRADEMARK OFFICE
CERTIFICATE OF CORRECTION

| | | |
|---|---|---|
| PATENT NO. | : 11,202,382 B2 | Page 1 of 1 |
| APPLICATION NO. | : 16/966152 | |
| DATED | : December 14, 2021 | |
| INVENTOR(S) | : Zikang Feng | |

It is certified that error appears in the above-identified patent and that said Letters Patent is hereby corrected as shown below:

On the Title Page

Item (30) should be added as follows:
Foreign Application Priority Data
Dec. 12, 2019 (CN)............................ 201911316338.7

Signed and Sealed this
Eighteenth Day of October, 2022

*Katherine Kelly Vidal*

Katherine Kelly Vidal
*Director of the United States Patent and Trademark Office*